United States Patent [19]

Riseman

[11] 4,106,050
[45] Aug. 8, 1978

[54] INTEGRATED CIRCUIT STRUCTURE WITH FULLY ENCLOSED AIR ISOLATION

[75] Inventor: Jacob Riseman, Poughkeepsie, N.Y.

[73] Assignee: International Business Machines Corporation, Armonk, N.Y.

[21] Appl. No.: 719,888

[22] Filed: Sep. 2, 1976

[51] Int. Cl.² ............................................. H01L 27/04
[52] U.S. Cl. ........................................................ 357/49
[58] Field of Search ........................ 357/49, 47, 50, 55

[56] References Cited

U.S. PATENT DOCUMENTS

| | | | |
|---|---|---|---|
| 3,332,137 | 7/1967 | Kenney | 357/49 X |
| 3,489,961 | 1/1970 | Frescura et al. | 357/49 X |
| 3,513,022 | 5/1970 | Casterline et al. | 357/49 X |
| 3,647,585 | 3/1972 | Fritzinger et al. | 156/17 |
| 3,689,992 | 9/1972 | Schutze et al. | 29/577 |
| 3,787,710 | 1/1974 | Cunningham | 357/49 X |
| 3,905,037 | 9/1975 | Bean et al. | 357/60 |

Primary Examiner—Stanley D. Miller, Jr.
Assistant Examiner—James W. Davie
Attorney, Agent, or Firm—Julius B. Kraft; Theodore E. Galanthay

[57] ABSTRACT

An integrated circuit member structure comprising a semiconductor substrate having formed therein a pattern of cavities extending from one surface of the substrate into the substrate and fully enclosed within said member, a plurality of pockets of semiconductor material extending from said substrate laterally surrounded and electrically insulated by said cavities and a planar layer of electrically insulative material on said surface.

5 Claims, 8 Drawing Figures

INTEGRATED CIRCUIT STRUCTURE WITH FULLY ENCLOSED AIR ISOLATION

BACKGROUND OF THE INVENTION

The present invention relates to integrated circuit structures and more particularly to dielectric isolation in such integrated circuit structures, particularly by air-isolation.

The form of most existing integrated circuits is the so-called monolithic form. Such a structure contains great numbers of active and passive devices in a block or monolith of semiconductor material. Electrical connections between these active and passive devices are generally made on a surface of the semiconductor block of material. Until recently, junction isolation has been by far the most widely practiced manner of isolating devices or circuits in the integrated circuit from each other. For example, active P-type diffusions are customarily used to isolate conventional FET and bipolar devices from one another and from other devices such as the resistors and capacitors. Such junction isolation is also used in integrated circuits utilizing field effect transistor devices. More detailed descriptions of junction isolation may be found in U.S. Pat. Nos. 3,319,311; 3,451,866; 3,508,209 and 3,539,876.

Although junction isolation has provided excellent electrical isolation in integrated circuits which have functioned very effectively over the years, at the present stage of the development of the integrated circuit art, there is an increasing demand in the field of digital integrated circuits for faster switching circuits. It has long been recognized that the capacitive effect of the isolating P-N junctions has a slowing effect on the switching speed of the integrated circuits. Until recently, the switching demands of the integrated circuits have been of a sufficiently low frequency that the capacitive effect in junction isolation has presented no major problems. However, with the higher frequency switching demand which can be expected in the field in the future, the capacitive effect produced by junction isolation may be an increasing problem. In addition, junction isolation requires relatively large spacing between devices, and, thus, relatively low device densities which is contrary to higher device densities required in large scale integration. Junction isolation also tends to give rise to parasitic transistor effects between the isolation region and its two abutting regions. Consequently, in recent years there has been a revival of interest in integrated circuits having dielectric isolation instead of junction isolation. In such dielectrically isolated circuits, the semiconductor devices are isolated from each other by insulative dielectric materials or by air.

Conventionally, such dielectric isolation in integrated circuits has been formed by etching channels in a semiconductor member corresponding to the isolation regions from the back side of the member, i.e., the side opposite to the planar surface at which the devices and wiring of the integrated circuit are to be formed. This leaves an irregular or channeled surface over which a substrate back side, usually a composite of a thin dielectric layer forming the interface with the semiconductor member covered by a thicker layer of polycrystalline silicon is deposited. Alternatively, the polycrystalline silicon need not be deposited in which case, the channels would provide air-isolation. Next, the other or planar surface of the semiconductor member may be either mechanically ground down or chemically etched until the bottom portions of the previously etched channels are reached. This leaves the structure wherein a plurality of pockets of semiconductor material surrounded by a thin dielectric layer are either supported on a polycrystalline silicon substrate and separated from each other by the extensions of the polycrystalline substrate or in the absence of the polysilicon, a structure in which the pockets of semiconductor material are, in effect, "air-isolated" from each other. While such structures provide an essentially flat and thus wirable planar surface of coplanar pockets of semiconductor material, such integrated circuit structures have limited utility with integrated circuits of high device densities. This is due to the fact that the etched channels which correspond to the isolation regions must be formed from the back side of the integrated circuit substrate and etched until the level of the active planar surface of the substrate is reached.

It is recognized in the art that when etching from the back side of an integrated circuit member the etching must be made to greater depth than when etching directly from the planar front surface in order to insure uniform lateral isolation. It is also recognized that when etching through a member, the extent of lateral etching will be substantially the same as the depth of etching. Accordingly, when etching channels from the back side of the substrate, so much lateral "real estate" is consumed on the wafer that such an approach has very limited practicality in high density integrated circuits.

On the other hand, if the etching to form the channels in the above dielectric isolation or air-isolation structure is carried out from the active or front surface of the integrated circuit, only limited lateral etching is necessary to reach practical isolation depths. However, the result is an essentially corrugated active surface rather than a planar one. Such a corrugated active surface is, of course, difficult to wire, i.e., form integrated circuit metallurgy interconnections by conventional photolithographic integrated circuit fabrication techniques.

Another approach which has been utilized for forming lateral dielectric isolation in the art involves the formation of recessed silicon dioxide lateral isolation regions, usually in the eptitaxial layer where the semiconductor devices are to be formed, through the expedient of first selectively etching a pattern of recesses in the layer of silicon, and then thermally oxidizing the silicon in the recesses with appropriate oxidation blocking masks, e.g., silicon nitride masks, to form recessed or inset regions of silicon dioxide which provide the lateral electrical isolation. Representative of the prior art teaching in this area are U.S. Pat. No. 3,648,125 and an article entitled, "Locos Devices," E. Kooi et al., Philips Research Report 26, pp. 166 – 180 (1971).

While this approach has provided both planarity at the active device integrated circuit surface as well as good lateral dielectric isolation, it has encountered some problems. Originally, the art applied the silicon nitride masks directly onto the silicon substrates. This gave rise to problems associated with high stresses created on the underlying silicon substrate by the silicon nitride-silicon interface. Such stresses were found in many cases to produce dislocations in the silicon substrate which appear to result in undesirable leakage current pipes and otherwise adversely affect the electrical characteristics of the interface. In order to minimize such interface stresses with silicon nitride layers, it has become the practice in the art to form a thin layer of silicon dioxide between the silicon substrate and the silicon nitride layer. During such thermal oxidation, there is a substantial additional lateral penetration of silicon oxide from the thermal oxidation beneath the silicon nitride. This lateral penetration is greatest at the mask-substrate interface to provide a laterally sloping structure known and recognized in the prior art as the undesirable, "bird's beak."

The publications, "Local Oxidation of Silicon; New Technological Aspects," by J. A. Appels et al., Philips Research Report 26, pp. 157 – 165, June 1971, and "Selective Oxidation of Silicon and Its Device Application," E. Kooi et al., *Semiconductor Silicon* 1973, published by the Electrochemical Society, Edited by H. R. Huff and R. R. Burgess, pp. 860 – 879, are representative of the recognition in the prior art of the "bird's beak" problems associated with silicon dioxide-silicon nitride composite masks, particularly when used in the formation of recessed silicon dioxide by thermal oxidation. Because of such "bird's beak" problems, the art has experienced some difficulty in achieving well-defined lateral isolation boundaries.

In addition, while, as previously mentioned, air isolation has been used in the prior art in integrated circuits, no practical approach has been developed for the application of air isolation to high density, large scale integrated circuits.

SUMMARY OF THE INVENTION

Accordingly, it is an object of the present invention to provide an air-isolated integrated circuit structure with a planar wirable surface.

It is another object of the present invention to provide an air-isolated integrated circuit structure in which the air isolation regions are of minimal dimensions so that the integrated circuit structure is adaptable to high-device density integrated circuits.

It is a further object of the present invention to provide an air-isolated integrated circuit structure in which both the upper and lower surfaces of the structure are planar.

It is yet a further object of the present invention to provide a dielectrically isolated integrated circuit structure in which both upper and lower surfaces are planar and which is substantially free from stresses created by changes in volume in the semiconductor material during integrated circuit fabrication heating steps.

It is an even further object of the present invention to provide a method for fabricating an integrated circuit structure having the above described advantages.

In accordance with the present invention, there is provided an integrated circuit member comprising a semiconductor substrate having formed therein a pattern of cavities extending from one surface of the substrate into the substrate and fully enclosed within the member, a plurality of pockets of semiconductor material extending from said surface laterally surrounded and electrically insulated by said cavities and a planar layer of electrically insulative material on the surface.

The integrated circuit member is formed by a fabrication method comprising first etching a pattern of cavities extending from one surface of a first silicon substrate into the substrate; the cavities laterally surround and electrically isolate the plurality of silicon substrate pockets. Next, a first layer of silicon dioxide is formed on this first substrate surface. There is also formed over a second silicon substrate a planar second layer comprising a glass, and preferably a siliceous glass. The glass composition may be any conventional glass composition including those described in Volume 10, pp. 533 – 546, of the Encyclopedia of Chemical Technology, Kirk and Othmer, Second Edition, published in 1966 by Interscience Publishers. However, the silicate glasses, such as those described on pp. 540 – 545 in the above encyclopedia, have been found to be particularly desirable. The term "siliceous glass" as used in this application, is meant to include all silica-containing glasses including glasses which are substantially unmodified silica ($SiO_2$). In addition, among the silicate glasses which may be used are alkali silicate glasses which are modified by $Na_2O$, soda-lime glasses, borosilicate glasses, alumino-silicate glasses, and lead glasses. Then, the two substrates are bonded together by fusing the planar layer over the second substrate to the silicon dioxide layer over the first substrate to thereby fully enclose the cavities. Finally, the second silicon substrate is removed from the fused structure.

The resulting structure is one having a planar surface, at which the active devices of the integrated circuit may be subsequently formed, i.e., the surface of the first silicon substrate covered by the planar layer of silicon dioxide. Further, since the cavities have been formed by etching down from this surface rather than the back side surface of the structure, only minimal lateral integrated circuit "real estate" has been consumed in forming such cavities. In addition, the back side surface of the structure remains unetched and thus planar. Finally, because of the fully enclosed air-isolation, the structure has cavities capable of absorbing changes in volume of the silicon material resulting from the application of heat during the processing steps. Thus, heat-induced stresses are minimized.

The foregoing and other objects, features and advantages of the invention will be apparent from the following more particular description of the preferred embodiments of the invention, as illustrated in the accompanying drawings.

PREFERRED EMBODIMENTS OF THE PRESENT INVENTION

FIGS. 1 – 7 illustrate the preferred embodiment of the present invention. On a suitable P— wafer 10 having a resistivity of 10 ohm/cm, an N+ region 11 which will subsequently serve as a subcollector is formed by conventional thermal diffusion of impurities as set forth for example in U.S. Pat. No. 3,539,876. When introduced into substrate 10, N+ region 11 has a surface concentration of $10^{21}$ atoms/$cm^3$. Region 11 may also be formed by conventional ion implantation techniques.

Figure 1:
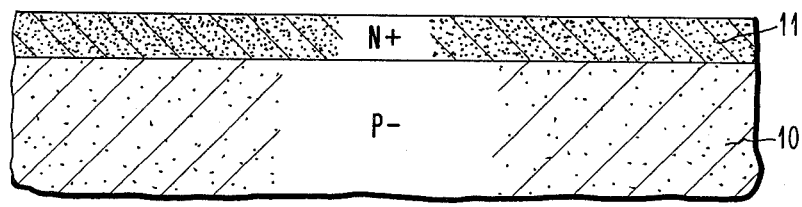
FIGS. 1 – 7 are diagrammatic sectional views of a portion of an integrated circuit in order to illustrate the method of forming the preferred embodiment of the present invention.
Figure 2:
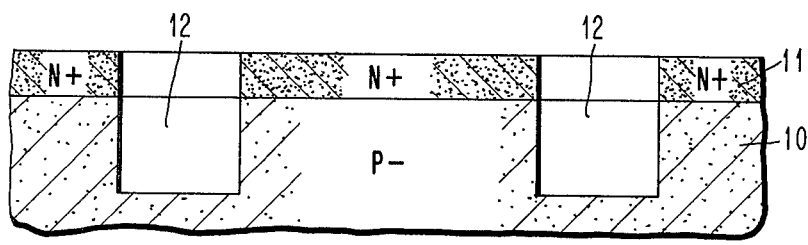

Then, FIG. 2, a pattern of recesses or cavities 12 are etched in the substrate. This pattern of recesses corresponds to the desired air-isolation pattern for the integrated circuit structure. Recesses 12 are formed by etching utilizing a conventional mask such as a silicon dioxide mask formed by standard photolithographic integrated circuit fabrication techniques which mask has apertures corresponding to the recessed pattern to be formed. Then, the substrate may be etched in the conventional manner through the apertures defined in the silicon dioxide mask.

It should be noted that these recesses may be formed utilizing a conventional etchant for silicon such as a composition of nitric acid and diluted hydrofluoric acid in which case they will have the conventional sloped or tapered shape of recesses etched in silicon. Alternatively, they may be formed by a technique of vertical-walled etching as described in the aforementioned R.C.A. Review article, June 1970, particularly at pages 272 - 275, wherein the substrate 10 should have a (110) surface orientation and the etchant utilized would be a boiling mixture of 100 grams KOH in 100 cc of water in which case recesses 12 will have the substantially vertical-walled structure. For purposes of the present illustration, recesses 12 are in the order of 2 microns in depth.

Figure 3:
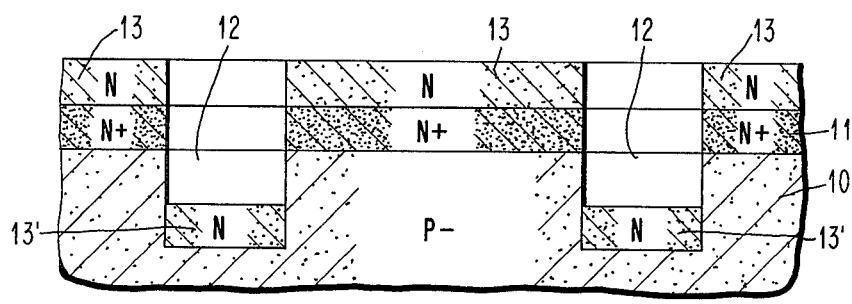

Next, FIG. 3, utilizing conventional integrated circuit fabrication techniques, N-type epitaxial layer 13 is deposited over the substrate. Epitaxial layer 13 has a maximum impurity concentration or doping level of $10^{18}$ atoms/cm$^3$ and is deposited by conventional techniques at a temperature in the order of from 950° - 1150° C. During the deposition of epitaxial layer 13, portions of the layer 13' are deposited in cavities 12. Layer 13 has a thickness of about 2 microns. It should be noted that if it is considered desirable in the integrated circuit structure to avoid deposition of epitaxial layer portions 13' in the cavities 12, epitaxial layer 13 may be deposited immediately after Step 1 and prior to the formation of the cavities in Step 2. In such a case, cavities 12 should be etched to a depth beyond the P−/N+ junction. Since substrate 10 is P−, it may be subject to conventional surface inversion problems well-known in the art in certain integrated circuit applications. A higher concentration of P dopant may be introduced in those portions of cavity 12 abutting substrate 10 by standard impurity introduction techniques such as diffusion or ion implantation subsequent to the formation of the trench but prior to the formation of silicon dioxide layer 14.

Figure 4:
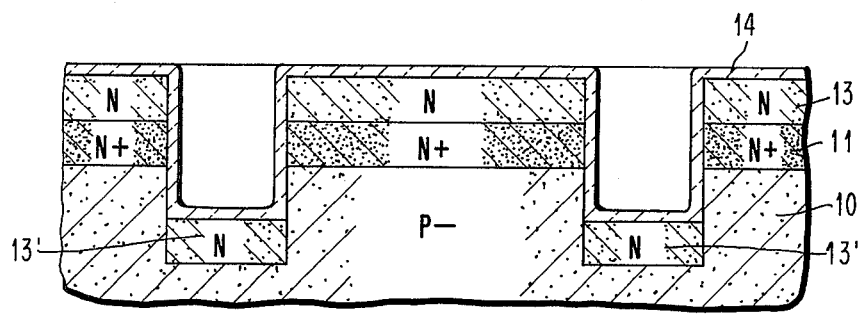

Next, FIG. 4, a layer of silicon dioxide 14 preferably having a thickness in the order of from 3000 Å - 10,000 Å is formed over the surface as shown using any conventional silicon dioxide formation technique such as chemical vapor deposition or RF sputter deposition, or preferably, by standard thermal oxidation.

Figure 4A:
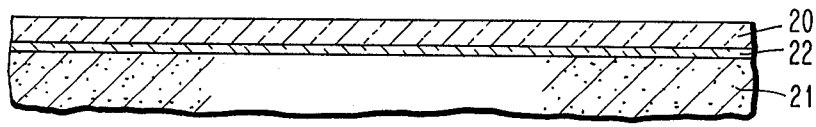
Figure 5:
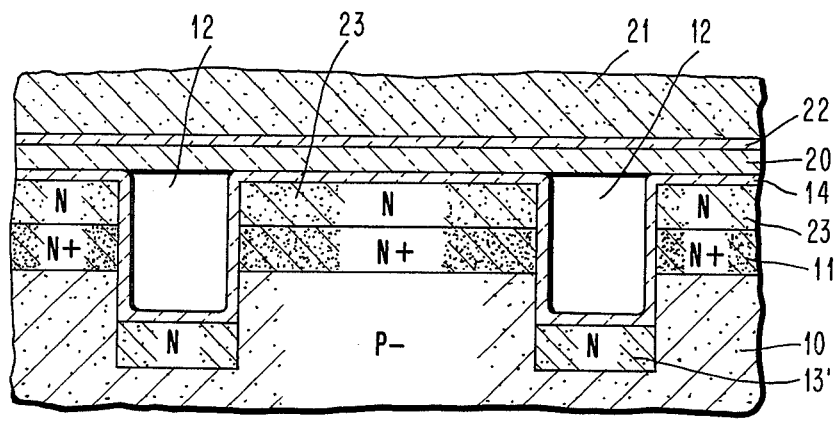

Next, as shown in FIG. 4A, a layer of silicon dioxide 20 which is to provide the planar surface of the integrated circuit structure is deposited on a separate wafer 21 of silicon. Wafer 21 should be as thin as possible but still be handleable without breakage. Wafer 21 may be either monocrystalline or polycrystalline silicon. Such a thickness may be conveniently between 3 and 5 mils. Silicon dioxide layer 20 which has a thickness in the order from ½ to 3 microns may be formed by any of the conventional techniques for forming silicon dioxide on a semiconductor substrate, e.g., chemical vapor deposition, sputter deposition or thermal oxidation of the silicon substrate. However, in accordance with one aspect of the present invention which will be described in the present embodiment, it may be desirable to have an intermediate layer of an etch barrier material such as silicon nitride between silicon substrate 21 and silicon dioxide layer 20. As will be hereinafter described, when silicon substrate 21 is removed by chemical etching, silicon nitride is somewhat more resistant to conventional silicon etchants than is silicon dioxide, although silicon dioxide is also resistant to such etchants and may be used alone without the nitride. In any event, if, as in FIG. 4A, silicon nitride is to be used, a layer 22 having a thickness in the order of from 1000 Å - 2000 Å may be formed by any conventional technique such as the chemical vapor deposition reaction of silane and ammonia. Alternatively, silicon nitride layer 22 may be deposited by conventional RF sputter deposition techniques.

At this point, the structure of FIG. 4A is abutted against the structure of FIG. 4 and silicon dioxide layer 20 is fused to silicon dioxide layer 14 to fully enclose cavity pattern 12.

The fusion of layers 14 and 20 may be achieved by heating the abutting structure in the steam atmosphere at temperatures in the order of 1200° C for about one-half hour. Alternatively, fusion temperature may be reduced by forming a thin layer of phosphosilicate glass or borosilicate glass on the surfaces of either silicon dioxide layers 14 and 20. This may be accomplished by the simple expedient of slightly etching the surfaces of layers 14 and 20 prior to the fusion step to make these layers hydrophilic and then depositing a small amount of either boric acid solution (saturated aqueous boric acid solution) or dilute phosphoric acid solution on either or both of the layers 14 and 20. This results in a thin layer of either borosilicate or phosphosilicate glass being formed on the surface of the silicon dioxide layers thus treated. These glasses may also be formed by doping with boron or silicon in the conventional manner. When such a thin borosilicate or phosphosilicate glass layer is formed on the surface, the fusion step may be then carried out at a lower temperature in the order of 1100° C by heating in an oxidizing ambient, e.g., heating in steam for about 15 minutes followed by heating in dry oxygen for about 15 minutes to complete the fusion. Alternatively, the slight etch to make one of the layers hydrophilic may be used alone to similarly reduce the required fusion temperatures.

In a variation of the illustrated embodiment, any standard borosilicate or phosphosilicate glass having a high melting point of at least 1100° C may be used in place of silicon dioxide to provide the siliceous material of layer 20. This high temperature glass may be deposited by any conventional technique such as sedimentation, RF sputtering or vapor phase deposition.

Figure 6:
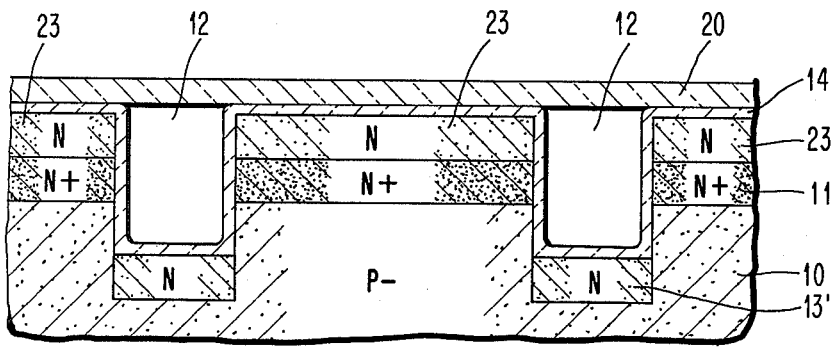
Figure 7:
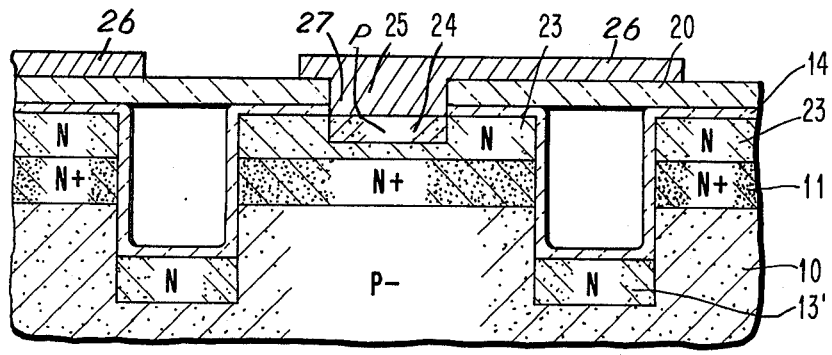

Silicon substrate 21 is then removed and silicon nitride layer 22 optionally removed to provide the structure shown in FIG. 6 wherein silicon dioxide layer 20 provides a planar surface over the entire structure fully enclosing air-isolation cavity pattern 12. Silicon wafer 21 may be removed by any combination of conventional wafer polishing, grinding or etching techniques. Most conveniently, most of the upper portion of substrate 21, FIG. 5, may be first removed by any conventional polishing or grinding technique followed by any conventional etching technique including chemical etching or sputter etching with either nonreactive or reactive ions. As set forth previously, the etching may be carried out using selected etchants or etching techniques to which either the silicon nitride layer 22 if used or the silicon dioxide layer 20 is more resistant than is silicon wafer 21. If present, the silicon nitride layer 22 may be optionally removed using a conventional etchant for silicon nitride to which the silicon dioxide is resistant. Such a conventional etchant for silicon nitride is hot phosphoric acid or hot phosphoric salt.

The resulting structure shown in FIG. 6 has a planar silicon dioxide layer over a plurality of silicon pockets 23 which are laterally air-isolated by cavity pattern 12.

Then, utilizing the structure of FIG. 6, the active devices of the integrated circuit may be formed utilizing conventional integrated circuit fabrication techniques to introduce regions of selected conductivity-types such as P region 24 into isolated silicon pockets 23 (FIG. 7) through openings 25 formed in silicon dioxide layer 20 by conventional integrated circuit photolithographic fabrication techniques. Then, after such regions are formed, the regions may be readily interconnected by conventional integrated circuit metallization or wiring techniques subsequently formed on the planar surface of silicon dioxide layer 20, e.g., metallization layer 26 connected to P region 24 through metal contact 27.

It should be noted that for any of the foregoing processing steps involving etching either to form recesses in layers or substrates or to remove layers, any conventional etching technique may be employed such as those described in U.S. Pat. No. 3,539,876. Alternatively, any of the above etching steps may be carried out by sputter etching, utilizing conventional sputter etching apparatus and methods such as those described in U.S. Pat. No. 3,598,710, particularly sputter etching carried out utilizing reactive gases such as oxygen or hydrogen or chlorine. U.S. Pat. No. 3,471,396 sets forth a listing of inert or reactive gases or combinations thereof which may be used in sputter etching.

While the invention has been particularly shown and described with reference to the preferred embodiments thereof, it will be understood by those skilled in the art that various changes in form and details may be made therein without departing from the spirit and scope of the invention.

What is claimed is:

1. An integrated circuit member structure comprising:
   a semiconductor substrate having formed therein a pattern of cavities extending from one surface of said substrate into the substrate,
   a plurality of pockets of semiconductor material extending from said surface laterally surrounded and electrically insulated by said cavities,
   a planar layer of electrically insulative material over said surface,
   said cavities being fully enclosed by the combination of said substrate and said planar layer, and
   a metallization pattern formed on said layer of insulative material and selectively connected to a plurality of said pockets.

2. The structure of claim 1 wherein the lateral surfaces of said pockets abutting said cavities have formed thereon a layer of electrically insulative material.

3. The integrated circuit member of claim 2 wherein said substrate is a silicon substrate and said planar layer is a layer of silicon dioxide.

4. The integrated circuit member of claim 3 wherein said layer formed on said cavities is a layer of silicon dioxide.

5. The integrated circuit member of claim 2 wherein each of a plurality of said pockets is formed of a semiconductor material of one conductivity-type having formed therein at least one region of opposite conductivity-type extending from the substrate surface of the pocket into the pocket to provide an integrated circuit device.

* * * * *